United States Patent [19]

Jaycox et al.

[11] Patent Number: 4,599,554
[45] Date of Patent: Jul. 8, 1986

[54] VERTICAL MOSFET WITH CURRENT MONITOR UTILIZING COMMON DRAIN CURRENT MIRROR

[75] Inventors: Jeffrey M. Jaycox, Allen; Dorman C. Pitzer, Plano, both of Tex.

[73] Assignee: Texet Corportion, Allen, Tex.

[21] Appl. No.: 679,939

[22] Filed: Dec. 10, 1984

[51] Int. Cl.⁴ .................................................. G05F 3/26
[52] U.S. Cl. .................................... 323/317; 307/242; 307/584
[58] Field of Search ............... 307/242, 571, 573, 577, 307/584; 323/315, 317

[56] References Cited

U.S. PATENT DOCUMENTS

| | | | |
|---|---|---|---|
| 3,454,894 | 7/1969 | Voorhoeve | 330/253 |
| 3,852,679 | 12/1974 | Schade | 330/253 |
| 3,956,645 | 5/1976 | Boer | 323/315 |
| 4,010,425 | 3/1977 | Dingwall et al. | 323/315 |
| 4,072,975 | 2/1978 | Ishitani | 357/55 |
| 4,152,662 | 5/1979 | Sakai et al. | 330/252 |
| 4,327,321 | 4/1982 | Suzuki et al. | 323/315 |
| 4,399,374 | 8/1983 | Boeke | 323/315 |
| 4,399,375 | 8/1983 | Sempel | 323/315 |
| 4,414,503 | 11/1983 | Hashimoto | 323/315 |

Primary Examiner—William H. Beha, Jr.
Assistant Examiner—J. Sterrett
Attorney, Agent, or Firm—Wofford, Fails & Zobal

[57] ABSTRACT

An improvement in a constant current circuit comprising a metal oxide semi-conductor field effect transistor (MOSFET) integrated circuit (IC) for providing a feedback voltage indicative of current flow as a control parameter for either on-off mode or linear feedback mode. The improvement comprises the usual drain, gate and source terminals with an additional feedback terminal and dual, parallel connected FET's formed into the MOSFET IC and connected in parallel to the drain and gate terminals. One of the FET's is much larger and has a much greater current carrying capability than the second one and the second one is connected serially with a resistor, the juncture of the second field effect transistor and resistor being connected with the feedback terminal to give a voltage indicative of current flow at the drain terminal.

6 Claims, 4 Drawing Figures

VERTICAL MOSFET WITH CURRENT MONITOR UTILIZING COMMON DRAIN CURRENT MIRROR

FIELD OF THE INVENTION

This invention relates to a constant current circuit. More particularly, it relates to an improvement in monitoring current flowing in a circuit and providing a feedback voltage that is related to the current flow such that the current monitoring device can be employed in an on-off control mode or in a linear feedback control mode.

DESCRIPTION OF THE PRIOR ART

The prior art has proven the desirability of providing a voltage parameter related to current flow in integrated circuit technology such that a constant current circuit could be employed in a wide variety of applications. Illustrative of the types of approaches employed in the prior art for providing constant current flow are the inventions described in the following U.S. patents. U.S. Pat. No. 3,454,894 shows stabilization of drain-electrode current of insulated gate field effect transistors. It employs a direct current bias (positive for N-type substrates and negative for P-type substrates), of magnitudes sufficient to minimize sensitivity to external drift and to minimize the tendency for long term drift, applied between substrate and source electrodes. The invention described in that patent is not an integrated circuit and could not be used as is this invention. It is more nearly analogous to a conventional metal oxide semi-conductor (MOS).

U.S. Pat. No. 3,852,679 shows a current mirror amplifier for combining the output currents of metal oxides semi-conductor source-coupled differential amplifiers and includes first and second bi-polar transistors having parallel to base-emitter circuits including emitter degenerative resistors. The invention of that patent is not really accomplishing the same thing as this invention and is inordinately complex for most of the integrated circuit work for which this invention is designed.

U.S. Pat. No. 4,072,975 describes an insulated gate field effect transistor (FET). The dopings in the figures are complex and the invention could not be deemed economically feasible for the applications for which this invention is designed and employed.

U.S. Pat. No. 4,152,662 describes a pre-amplifier with an integrated circuit in which the active elements of the first stage and the resistor which establishes the current flowing through these active elements are mounted on the outside of the integrated circuit with the remaining pre-amplifier components inside the integrated circuit.

U.S. Pat. No. 4,327,321 describes a very interesting approach to accomplishing the same end as this invention. It describes a constant current circuit with a constant current source capable of feeding a constant current to a load connected in series with the source drain path of a low drive MOSFET (metal oxide semi-conductor field effect transistor). That invention employs a current mirror comprising first and second P-channel MOSFET's, and first and second N-channel MOSFET's connected in series with the first and second P-channel MOSFET's, respectively. To avoid dependence on variations in power source voltage and/or threshold voltage characteristics of the MOSFET's, a resistor is inserted between the first P- and N- channel MOSFET's and the gate of the low drive MOSFET is coupled to both the junction of the resistor and first N-channel MOSFET and the gate of the second N-channel MOSFET.

U.S. Pat. No. 4,399,375 shows a current stabilizer comprising two enhancement field effect transistors which are each included in one of two current paths. One of the field effect transistors has a gate-source voltage which has a constant voltage difference with respect to the gatesource voltage of the other transistor by including between the gate electrodes of the two field effect transistors a biased bi-polar semi-conductor junction.

From the foregoing it can be seen that the prior art does not provide the economical, simple, integrated circuit for providing a current sensing feedback voltage from a MOSFET such as this invention employs.

Specifically, the prior art failed to provide a constant current monitor in which a feedback voltage was provided that was indicative of the current flowing at the drain for the integrated circuit MOSFET. The voltage can then be employed as a parameter for control in an on-off sense, to sound an alarm in the event of a shorted circuit, non-conductive circuit; or to serve as a parameter for a linear feedback controller as desired. The modern trend toward miniaturization and the use of as low a current as possible in the small integrated circuit devices such as clocks, calculators and the like, this type invention becomes significant in the integrated circuit technology.

Much of the prior art employs bi-polar devices which are a different kind of current conductors. There is more distortion in a bi-polar device which are also less accurate. The MOSFET's on the other hand may comprise many cells each carrying the same current and the proportion that is ratioed off and passed through the sensing resistor represents a more accurate and more nearly a true proportion of the current carrying capacity. Yet, the amount that is ratioed off is so small so as not to deleteriously affect the performance of the circuit and does not adversely affect the "on" voltage of the device.

SUMMARY OF THE INVENTION

Accordingly, it is an object of this invention to provide a MOSFET that provides a feedback voltage that is related in a more nearly accurate manner to the current flowing through the circuit than the prior art bi-polar devices, yet is simpler and more economical to fabricate in quanity.

It is a specific object of this invention to provide a MOSFET that affords a feedback voltage that is related to the current flowing through the drain therefor and that can be employed in either an on-off controller or a linear feedback controller, that provides diagnostic feedback as to load conditions; for example, open, shorted, or the like; and that provides an input to a digital level shifter for purposes of handshake with forcing function; and that has the following advantages:
1. Gives load current monitoring with no resistive insertion loss;
2. That provides low level voltage feedback, that does not introduce high level load current perturbations into external circuits; and that offers user feedback matched to active switching temperature characteristics.

These and other objects will become apparent from the descriptive matter hereinafter, particularly when taken in conjunction with the appended drawings.

In accordance with this invention there is provided improvement in a constant current circuit comprising a MOSFET integrated circuit consisting essentially of a pair of field effect transistors connected in parallel with common drain terminal and gate terminal; at least one source terminal; at least a feedback terminal; a first of the field effect transistors having a relatively large first current carrying capability under operational conditions whereas a second one of the field effect transistors has a much lower second current carrying capacity under operational that is only a predetermined portion of the first load carrying capacity of the first field effect transistor; a first resistor Rf being serially connected with the second field effect transistor and at least one of the source terminals, the resistor being sufficiently small and in the low current side of the circuit to provide a feedback voltage Vf at the feedback junction that is related to the current flowing at the drain terminal.

Specific equivalent circuits as well as a cross-sectional view of a typical MOSFET are described herein.

DESCRIPTION OF PREFERRED EMBODIMENT(S)

This invention may be widely useful in many different kinds of technology from biomedical devices and sensor-controllers therefor through small calculators, mini computers, microprocessors, clocks or watches and the like. It is widely useful where it is desired to provide a constant current flow regardless of degradation of a power source such as a battery under loading. The invention will be described hereinafter as method and apparatus for providing a current sensing feedback voltage from a metal oxide field effect transistor (MOSFET). The following descriptive matter will be given with respect to a single cell and equivalent circuits, although it is to be realized that in integrated circuit technology there may be a plurality of such cells connected into a circuit.

Figure 1:
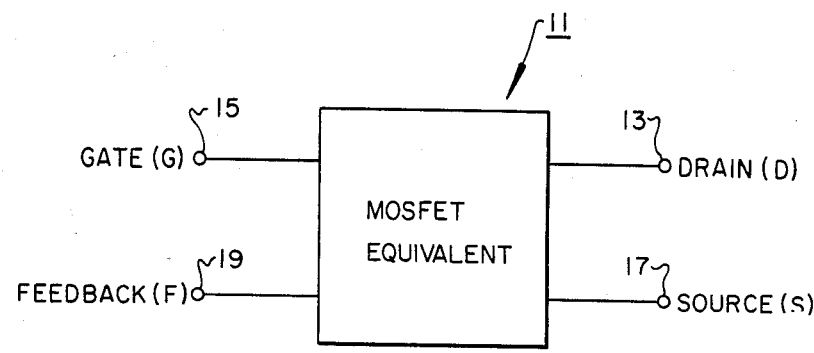
FIG. 1 is a diagramatic representation of the equivalent MOSFET in accordance with one embodiment of this invention.

Referring to FIG. 1, the device 11 includes a drain terminal 13, gate terminal 15, at least one source terminal 17 and a feedback terminal 19. These terminals are labeled in FIG. 1 with their proper name and in parenthesis thereafter the symbols that are employed in FIGS. 2 and 3 for the respective terminals.

This structure includes the standard connection with drain gate and source terminals, as with any MOSFET; and the back gate is internally tied to the source. Fabrication of MOSFET's and their use is well known and is documented in many texts. For example, BASIC INTEGRATED CIRCUIT ENGINEERING, Hamilton and Howard, McGraw-Hill book company, New York, N.Y., 1975, contains a description of fabrication of MOSFET at pages 198-206. Elsewhere in the cited text are described the various facets of MOSFET integrated circuit technology. In addition, in this invention, a fourth terminal is provided as a feedback output, shown by the feedback terminal 19. This feedback terminal provides a point for monitoring of voltage that is related to the current flowing through the drain terminal 13. In the illustrated embodiment of FIG. 2, the voltage is proportional to the current flowing through the drain terminal.

Figure 2:
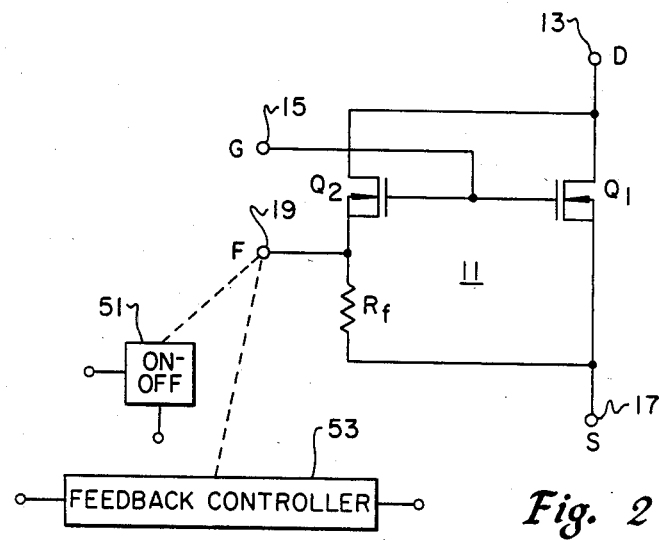
FIG. 2 is an equivalent circuit diagram of one of the embodiments of this invention.

Moreover, the structure in accordance with this invention provides the feedback feature in a semi-conductor structure that is only negligibly larger than a MOSFET of equal performance and conventional structure. FIG. 2 shows an equivalent circuit that is useful in explaining this invention. The structure operates as two MOSFETs in parallel, sharing common drains and gates. The two MOSFETs are labeled Q1 and Q2. The MOSFET Q1 is many times larger than Q2 but both are fabricated in the interdigitated method so as to yield nearly identical characteristics. For example, Q1 may be sufficiently larger than Q2 so as to pass one hundred times as much current as Q2 with the same operational conditions.

Figure 4:
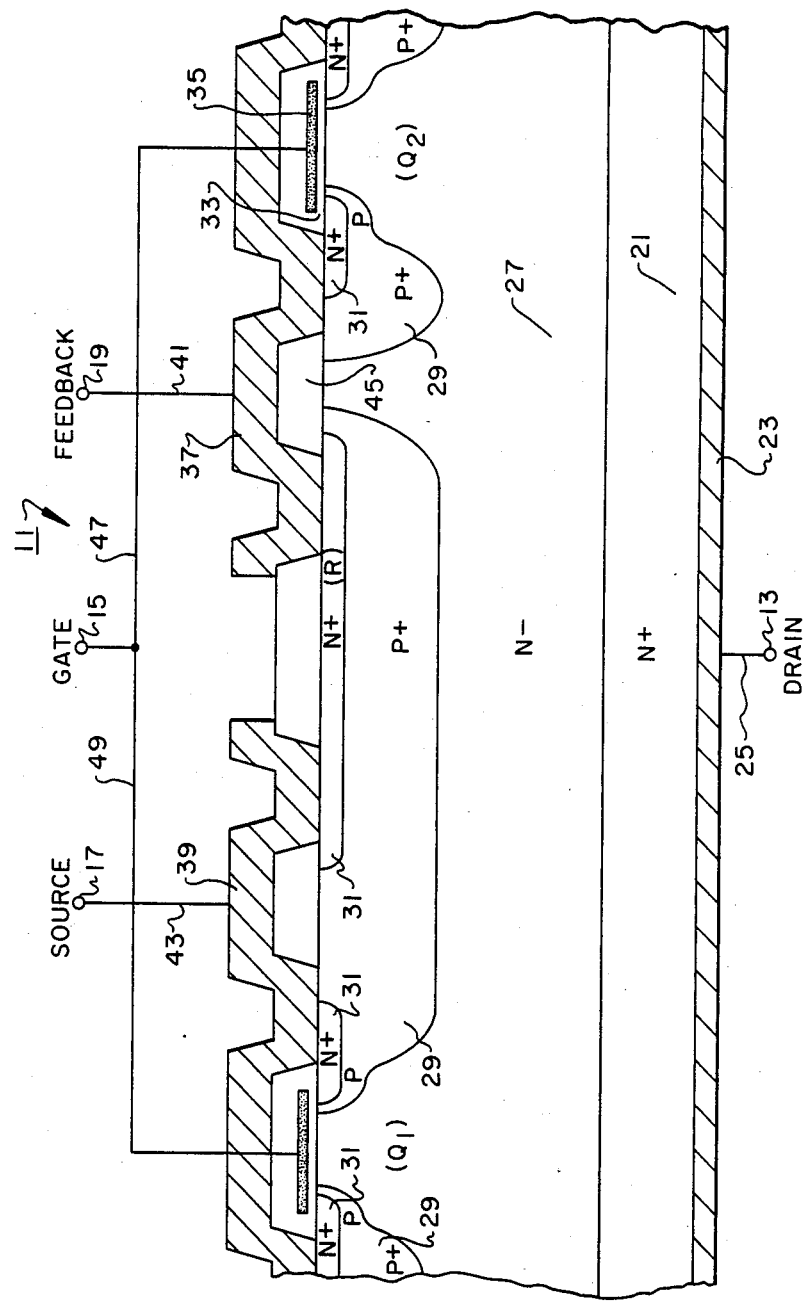
FIG. 4 is a cross-sectional view of one MOSFET cell in accordance with an equivalent circuit embodiment of FIG. 2.

FIG. 4 shows a typical cross-section of one embodiment of this invention. Referring to FIG. 4, the device 11 includes an N-type substrate 21 such as monocrystalline silicon that has been doped with antimony or arsenic to provide the N-plus (N+) characteristics. The drain terminal 13 is provided in a conventional manner such as the formation of a gold contact layer 23 to the backside of substrate 21, thereby providing a low resistivity electrical connection to the drain terminal 13. Exteriorly of the gold contact layer 23, the conductor is illustrated by the numeral 25 in FIG. 4. As the term conductor is employed herein, it may comprise either a conductive, low resistivity metal or a doped region of semi-conductor. Ordinarily, it is advantageous to use metal conductor exteriorly of the semi-conductor chip itself.

Formed on the substrate 21 is an N-type epitaxial silicon layer 27. Such an epitaxial layer may be formed by using the same antimony or arsenic doping in the silicon to form an N-type layer. If desired, in certain uses, P-type silicon layer such as formed by being doped with boron or the like can be employed to form such a layer. A plurality of body regions 29 of P-type silicon are then formed. For example, the P-type body regions may be formed by doping with boron.

By the term "doping" there is meant the exposing of a surface and allowing diffusion of the dopant impurity molecules to move into the predetermined region of the silicon or the like.

Formed adjacent the body regions 29 are a plurality of respective source regions 31. As illustrated, the source regions 31 are of N-type, such as formed by doping the silicon with arsenic. A thin layer of gate insulation 33 separates the gate electrode 35 for both the MOSFETs Q2 and Q1. Insulation also electrically isolates the gate electrode from the metal surface conductors 37, 39 forming, respectively, the conductors 41, 43 to, respectively, the feedback terminal 19 and the source terminal 17. Insulation 45 also prevents electrical contact between the respective metal conductors 37, 39 and other parts of the semi-conductor chip.

The insulation may be silicon nitride or silicon dioxide. Ordinarily from a pragmatic point of view, silicon dioxide is frequently preferred. The gate insulation 33 will be only 500°-1500° A (angstroms) in thickness.

The gate electrode may be formed from amorphous and polycrystalline silica. It may be doped with phosphorous or the like and may be about 8000° A thick. As indicated hereinbefore, the gate electrode for the MOSFET Q2 will be much larger in areal extent and dimension than that for the MOSFET Q1.

The metal conductors 37, 29 may be formed of any suitable conductor such as gold or aluminum or the like. Ordinarily, aluminum is economical, easy to work with and frequently preferred.

The gate electrode 35 for each of the respective MOSFETs Q1 and Q2 will be connected, as by conductors 47, 49 with the gate terminal 15.

Only one way of forming the device 11 has been described hereinbefore. There are a variety of conventional technology methods that can be employed once the physical nature of the device has been outlined and described; and these different methods are outlined in conventional texts such as the above-cited "BASIC INTEGRATED CIRCUIT ENGINEERING".

A small feedback resistor Rf is inserted between the intrinsic sources of Q1 and Q2. The resistance Rf is small so power dissipation is minimized. It is further minimized because the MOSFET Q2 is so much smaller than Q1 and handles so much less current. In this arrangement, the voltage is substantially directly proportional to the current flowing through the drain terminal at low current flow. Thus the feedback voltage at feedback terminal 19 is substantially linear. Even at higher current flows, it is satisfactory to provide on-off parameter for an on-off controller such as illustrated by the on-off controller 51 in FIG. 2. At low current flows it is quite satisfactory to provide a parameter for a linear feedback controller such as the controller 53 as illustrated in FIG. 2. Dashed lines are shown intermediate these respective controllers such that either or both may employ the parameter as desired.

In normal operation, with the gate biased above the source, current flows in both Q1 and Q2. If the resistor Rf is small, then the voltage drop across it will be small. In this case, the gate-to-source voltages across Q1 and Q2 are nearly equal, so that the current in each device is proportional to its size, shown by its width divided by its length (W/L). The feedback voltage at the feedback terminal relates to the total drain current by the approximate relationship shown by Equation I, as follows:

$$I_D = \frac{\left(\frac{W}{L}\right)_1 + \left(\frac{W}{L}\right)_2}{\left(\frac{W}{L}\right)_2} \cdot \frac{V_F}{R_F} \quad (I)$$

where $V_F$ = feedback voltage $V_f$, and
where $R_F = R_f$.

At higher currents, the voltage drop across Rf will not be negligble, causing distortion in the current-voltage relationship expressed by Equation I. Even in this situation, the feedback voltage may be used, either as an on-off current sensor or in linear feedback mode. The important point is that the larger power device is not degraded at all by the non-linearity of Q2 divided by Rf. Another point to be noted is the power dissipation is minimized in the device 11 in accordance with this invention.

Figure 3:
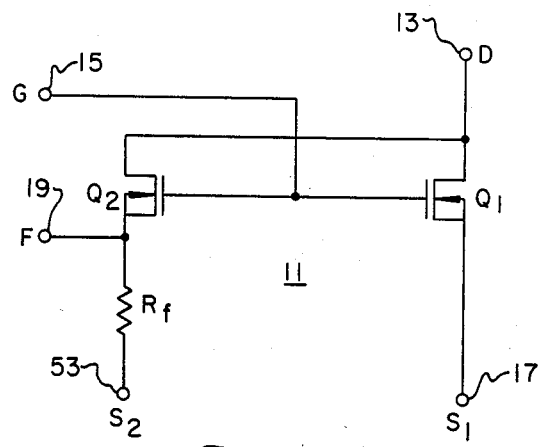
FIG. 3 is an equivalent circuit diagram of a second embodiment of this invention.

A second embodiment of this invention is shown in FIG. 3. In this circuit, the resistor Rf is disconnected from the source terminal 17, designated S1, and is connected with a second source terminal 53, designated S2. By such an arrangement, the source terminal S2 may be pulled to a lower voltage than S1 in a feedback scheme so that the voltage at feedback terminal F is the same as that at the first source terminal S1. In this manner, the total drain current may be monitored by the voltage drop $V_F - V_{S}2$ without any degradation at high current. This scheme would have the disadvantage of requiring a second, negative power supply, but would operate on currents much lower than the drain current.

From the foregoing it can be seen that this invention achieves the objects delineated hereinbefore. More specifically, this invention facilitates load current monitoring with no resistive insertion loss; provides low level voltage feedback that does not introduce high level load current perturbations into external circuits; and that offers user feedback matched to active temperature switching characteristics. This invention can be used advantageously with external linear devices to provide control of load current; can provide diagnostic feedback as to load condition to show whether the circuit is open, shorted, and the like; and can provide input to digital lever shifters for purposes of a handshake with a forcing function.

Although this invention has been described with a certain degree of particularity, it is understood that the present disclosure is made only by way of example and that numerous changes in the details of construction and the combination and arrangement of parts may be resorted to without departing from the spirit and the scope of the invention, reference being had for the latter purpose to the appended claims.

What is claimed is:

1. In a controlled current circuit, the improvement comprising a monolithic semi-conductor component performing the same function with substantially the same characteristics as a vertical metal/oxide/semi-conductor field effect transistor (MOSFET) and including an additional terminal providing an output voltage related to the current flowing in the device, consisting essentially of:
   a. a drain terminal;
   b. a gate terminal;
   c. at least one source terminal;
   d. a feedback terminal having voltage (Vf);
   e. a first vertical MOSFET having an intrinsic source, an intrinsic body, an intrinsic gate and an intrinsic drain and having its said intrinsic source connected to one said component source terminal, having its said intrinsic body connected to its said intrinsic source, having its said intrinsic gate connected to said component gate terminal, and having its said instrinsic drain connected to said component drain terminal;
   f. a second vertical MOSFET formed in the same substrate as the first MOSFET so that its intrinsic drain is formed by the same semi-conductor material as that of the first, making both drains necessarily and inseparably connected; a second MOSFET body connected to its intrinsic source, its intrinsic gate connected to said component gate terminal, and its intrinsic source connected to a first resistor (Rf);
   g. said first resistor (Rf) being serially connected to said second MOSFET intrinsic source, with the junction of said resistor and said source of said second MOSFET being connected with said component feedback terminal, having the opposite node of said resistor connected to a said component source terminal.

2. The monolithic semi-conductor component of claim 1 wherein only one source terminal is employed, allowing the component terminals to be utilized in the same manner as a normal vertical MOSFET with the current flowing in said first MOSFET being replicated in the second said MOSFET as with a current mirror; the current flowing in the second MOSFET also flowing through said resistor (Rf) so as to create a voltage drop across the resistor for being sensed at the feedback terminal for control purposes.

3. The monolithic semi-conductor component of claim 1 wherein two source terminals are employed, a first source terminal (S1) and a second source terminal (S2); said first MOSFET intrinsic source being connected to said first source terminal (S1) and said first resistor (Rf) connected to said second source terminal (S2); allowing the use of an external feedback circuit which senses and maintains a voltage on the feedback terminal equal to the voltage on said first source terminal (S1) by forcing a feedback voltage on said second source terminal (S2); this scheme enabling the monitoring of the total drain current through measurement of the voltage drop from said feedback terminal to said second source terminal (S2) so as to maintain both MOSFET intrinsic sources at the same voltage so as to allow current monitoring without distortion at high current levels.

4. The monolithic component of claim 1 wherein said voltage (Vf) at said feedback terminal is employed as an on-off sensor.

5. The component of claim 1 wherein said voltage (Vf) at said feedback terminal is employed as a feedback parameter for a feedback controller.

6. The component of claim 1 wherein said second MOSFET is smaller in size than said first MOSFET by a factor of 10 to at least 100, allowing for production of said components with substantially the same operating characteristics as ordinary vertical MOSFETS fabricating in the same technology yet with the same device size and hence cost.

* * * * *